United States Patent
Wang et al.

(10) Patent No.: US 7,786,479 B2
(45) Date of Patent: Aug. 31, 2010

(54) ARRAY SUBSTRATE FOR LCD AND METHOD OF FABRICATION THEREOF

(75) Inventors: Yeong-Feng Wang, Taoyuan County (TW); Chih-Jui Pan, Taoyuan County (TW)

(73) Assignee: Au Optronics Corp., Hsinchu (TW)

( * ) Notice: Subject to any disclaimer, the term of this patent is extended or adjusted under 35 U.S.C. 154(b) by 930 days.

(21) Appl. No.: 11/462,386

(22) Filed: Aug. 4, 2006

(65) Prior Publication Data
US 2007/0032036 A1     Feb. 8, 2007

(51) Int. Cl.
*H01L 31/062* (2006.01)
(52) U.S. Cl. .................. 257/59; 257/72; 257/E29.117
(58) Field of Classification Search ............ 257/59, 257/72, 291, 331, 332, 439, 443, E27.1, E29.117, 257/E29.145, E29.147, E29.151, E29.202; 438/151; 349/42, 46
See application file for complete search history.

(56) References Cited

U.S. PATENT DOCUMENTS 6,373,080 B1    4/2002  Gil
6,815,720 B2   11/2004  Kobayashi et al.
6,992,008 B2    1/2006  Kobayashi et al.
2002/0064894 A1 * 5/2002 Lee ........................... 438/30

FOREIGN PATENT DOCUMENTS

CN   1151405   2/2002
JP   62190762  8/1987
TW   574560    2/2004

* cited by examiner

*Primary Examiner*—Matthew C Landau
*Assistant Examiner*—Candice Y Chan
(74) *Attorney, Agent, or Firm*—Thomas, Kayden, Horstemeyer & Risley

(57) ABSTRACT

A liquid crystal display array substrate. A trench is in a substrate. A gate, a gate dielectric layer, a semiconductor layer and a doped semiconductor layer are disposed in the trench, wherein the semiconductor layer comprises a channel. A source electrode and a drain electrode are respectively electrically connected to portions of the semiconductor layer on opposite sides of the channel.

6 Claims, 6 Drawing Sheets

ARRAY SUBSTRATE FOR LCD AND METHOD OF FABRICATION THEREOF

BACKGROUND

The invention relates to an array substrate of a liquid crystal device and fabrication thereof, and in particular to a flat thin film transistor with high transmittance of an array substrate of a liquid crystal device and fabrication thereof.

Currently, Liquid crystal displays (LCD) are regarded as the mainstream among various flat panel displays. A working principle of the liquid crystal display is based on alignment orientation of liquid crystal molecules. Owing to dielectric anisotropy and conductive anisotropy of liquid crystal molecules, molecular orientation of liquid crystal molecules can be shifted under an external electronic field, such that various optical effects are produced. An LCD panel is generally made up of two substrates, with a certain gap preserved therebetween, and a liquid crystal layer filled in the gap. Respective electrodes are formed on the two substrates, respectively, to control the orientation and shift of liquid crystal molecules.

A conventional structure of a thin film transistor (TFT) used in a TFT flat display device is shown in FIG. 1, and its manufacturing process is described below. The substrate 10 has a TFT region, and a first metal layer is formed in the TFT region. The first metal layer is patterned to form a gate line 12 along a first direction by a first lithography and etching process. An insulating layer 14, a semiconductor layer 16, an n-doped silicon layer 18 and a second metal layer 20 are sequentially deposited over the gate line 12. The semiconductor layer 16 can be an amorphous silicon layer. A second lithography and etching process is used to pattern the amorphous silicon layer 16, the n-doped silicon layer 18 and the second metal layer 20 to expose the insulating layer 14. The second metal layer 20 is also patterned to form a signal line along a second direction, and the second direction is vertical to the first direction. The third lithography and etching processes are conducted to define a channel 19 between the second metal layer 20 and the n-doped silicon layer 18 so as to expose the amorphous silicon layer 16 in the channel 19. A source electrode and a drain electrode are formed and separated by the channel 19.

Due to a higher stack of the conventional TFT, orientations of liquid crystals around the thin film transistor are affected. In addition, the protruded thin film transistor also affects alignment of liquid crystals by rubbing. Further, multiple layers formed on pixels affect transmittance of a liquid crystal display panel, reducing brightness thereof.

Additionally, defects are easily formed at source electrodes and drain electrodes due to inadequate step coverage when forming the second metal layer 20. Shorts easily occur when sidewalls of the second metal layer are discontinuous, and layers thereunder are not well protected.

SUMMARY

These and other problems are solved or circumvented, and technical advantages are achieved, by preferred illustrative embodiments of the present invention, which provide a thin film transistor and fabrication thereof.

An embodiment of the invention provides a liquid crystal display array substrate. A trench is formed in a substrate. A gate, a gate dielectric layer, a semiconductor layer with a channel and a doped semiconductor layer are disposed in the trench. A source electrode and a drain electrode are respectively electrically connected to the semiconductor layer on opposite sides of the channel through the doped semiconductor layer.

Another embodiment of the invention provides a liquid crystal display array substrate. A dual damascene trench is formed in a substrate, comprising a first trench and a second trench formed overlying the first trench. A gate is disposed on a bottom portion of the first trench. A gate dielectric layer is disposed in the first trench, covering the gate. A semiconductor layer with a channel is disposed in the first trench and covers the gate dielectric layer. A source and a drain electrode are disposed in the second trench, respectively electrically connecting the semiconductor layer on opposite sides of the channel.

Further embodiment of the invention provides a method for forming an array substrate for a liquid crystal display, comprising: providing a substrate; forming a patterned first photoresist layer overlying the substrate; etching the substrate using the patterned first photoresist layer as a mask to form a first trench in the substrate; sequentially forming a first conductive layer, a gate dielectric layer, a semiconductor layer and a dielectric layer over the patterned first photoresist layer and in the first trench; stripping the patterned first photoresist layer to remove the first conductive layer, the gate dielectric layer, the semiconductor layer and the dielectric layer overlying the patterned first photoresist layer, wherein the first conductive layer in the first trench serves as a gate of a thin film transistor of the liquid crystal display; forming a patterned second photoresist layer to cover a portion of the dielectric layer in the first trench and a portion of the substrate near opposite sides of the first trench; etching exposed portions of the dielectric layer in the first trench and the substrate using the patterned second photoresist layer as a mask to form a second trench separated by a remaining portion of the dielectric layer; sequentially forming a doped semiconductor layer and a second conductive layer in the second trench and over the patterned second photoresist layer; and stripping the patterned second photoresist layer to remove the doped semiconductor layer and the second conductive layer overlying the patterned second photoresist layer; wherein the second conductive layer in the second trench, separated by the remaining portion of the dielectric layer, serves as a source electrode and a drain electrode.

DESCRIPTION OF THE DRAWINGS

The invention can be more fully understood by reading the subsequent detailed description and examples with references made to the accompanying drawings, wherein.

DETAILED DESCRIPTION

The following description disclosed the best-contemplated mode of carrying out the invention. This description is made for the purpose of illustrating the general principles of the invention and should not be taken in a limiting sense. The scope of the invention is best determined by reference to the appended claims.

In this specification, expressions such as "overlaying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Figure 1:
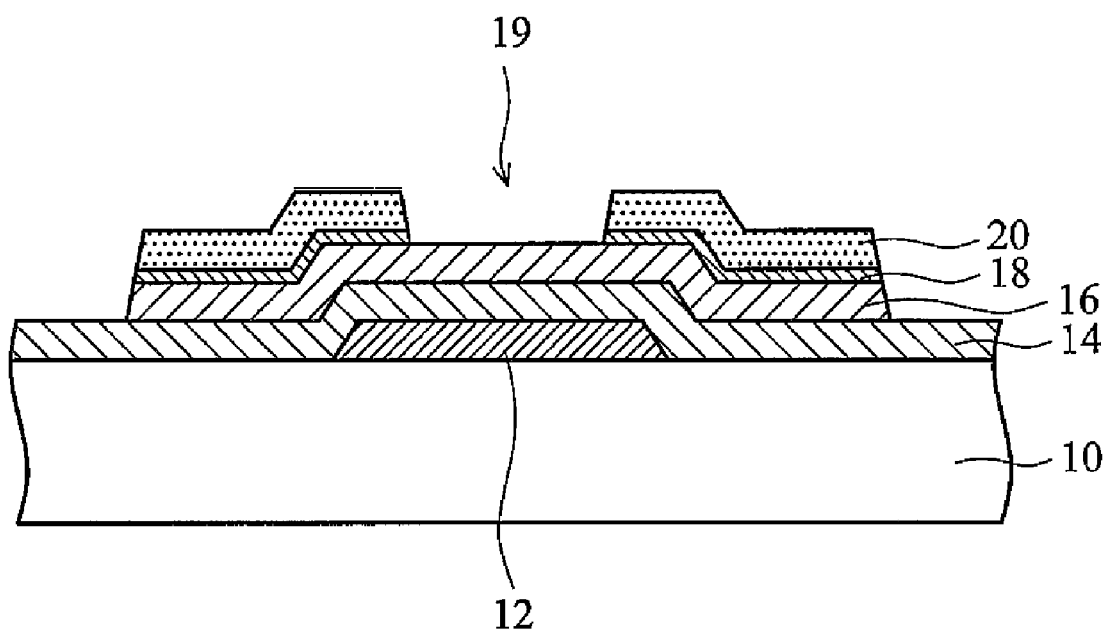
FIG. 1 shows a conventional thin film transistor.
Figure 2A:
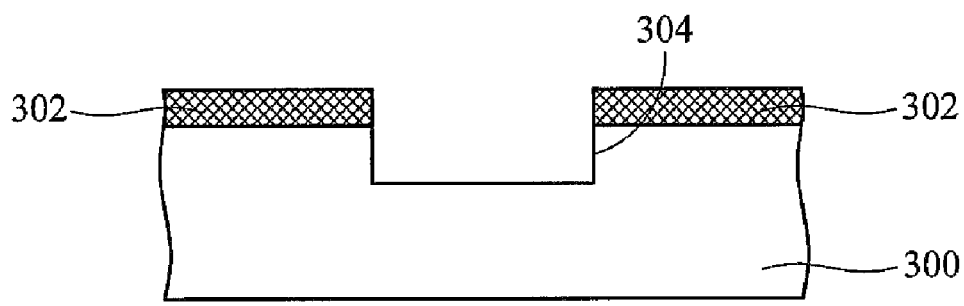
FIGS. 2A~2F illustrate process for forming a thin film transistor array substrate of an embodiment of the invention.

FIGS. 2A~2F illustrate process for forming a thin film transistor substrate of an embodiment of the invention. Referring to FIG. 2A, a substrate 300, such as a glass substrate, is provided, in which the substrate 300 preferably is a low alkali or a non-alkali substrate. Next, a photoresist layer 302 is coated on the substrate 300. The photoresist layer 302 is patterned by conventional photolithography, and preferably the patterned photoresist layer 302 comprises an opening exposing the substrate. Thereafter, the substrate 300 is etched by, for example dry etching, to form a trench 304.

Figure 2B:
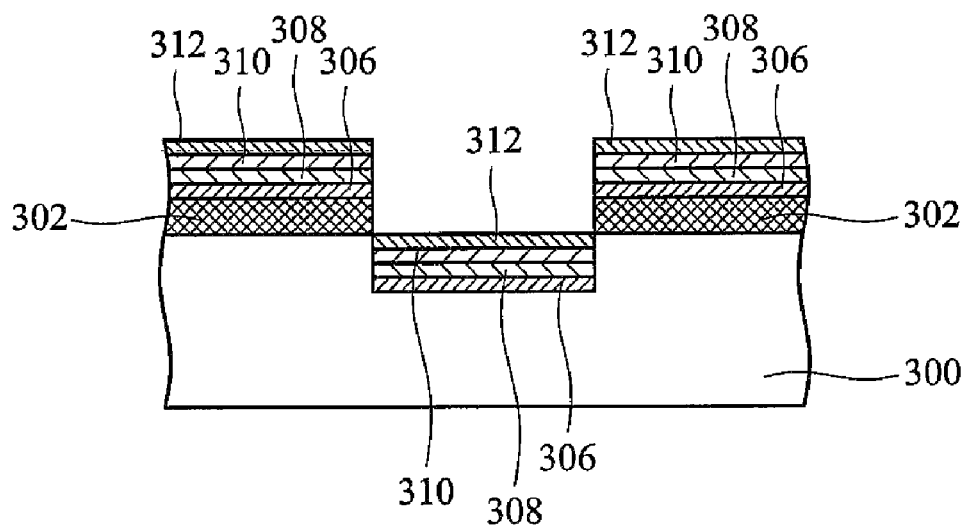

As shown in FIG. 2B, a first conductive layer 306, a gate dielectric layer 308, a semiconductor layer 310 and a doped semiconductor layer 312 are deposited over the photoresist layer 302 and filled the trench 304. The first conductive layer 306 can be Ta, Mo, W, Ti, Cr, Al, Au, Ag, Pt, Cu, a combination thereof or a stack layer thereof, which can be deposited by plasma vapor deposition (PVD) or plasma enhanced chemical vapor deposition (PECVD). The gate dielectric layer 308 can comprise silicon oxide, silicon nitride, silicon oxynitride or a combination thereof. In an embodiment of the invention, the semiconductor layer 310 comprises silicon, germanium, polysilicon or amorphous silicon. The doped semiconductor layer 312 can be a silicon or germanium doped with phosphorous or arsenic, presenting an n-type to reduce contact resistance.

Figure 2C:
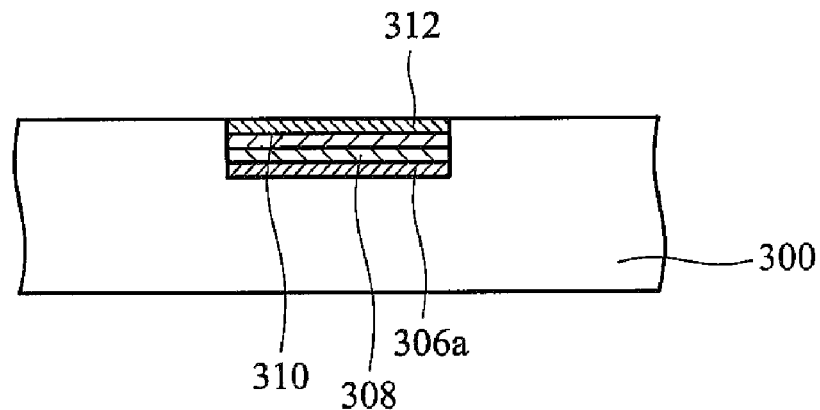

Next, as shown in FIG. 2C, a lift-off process is achieved, wherein the photoresist layer 302 is stripped by, for example etching or development, and the first conductive layer 306, the gate dielectric layer 308, the semiconductor layer 310 and the doped semiconductor layer 312 overlying the photoresist layer 302 are removed during removal of the photoresist layer 302. In an embodiment of the invention, a stripper, such as propyl-alcohol, which can be removed by methyl alcohol and methyl alcohol can further be removed by cleaning with deionized water, can remove the photoresist layer 202. Next, methyl alcohol is removed by cleaning with deionized water. Thereafter, the first conductive layer 306, gate dielectric layer 308, semiconductor layer 310 and doped semiconductor layer 312 residues on the substrate surface is removed by cleaning. In this embodiment, the first conductive layer within the trench 304 in the substrate 300 acts as a gate 306a of the thin film transistor. Preferably, a surface of the doped semiconductor layer 312 in the trench 304 is substantially coplanar with the surface of the substrate 300.

Figure 2D:
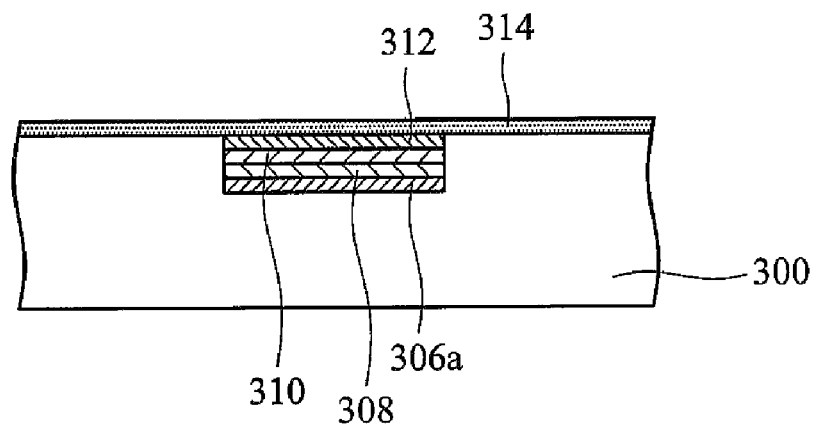
Figure 2E:
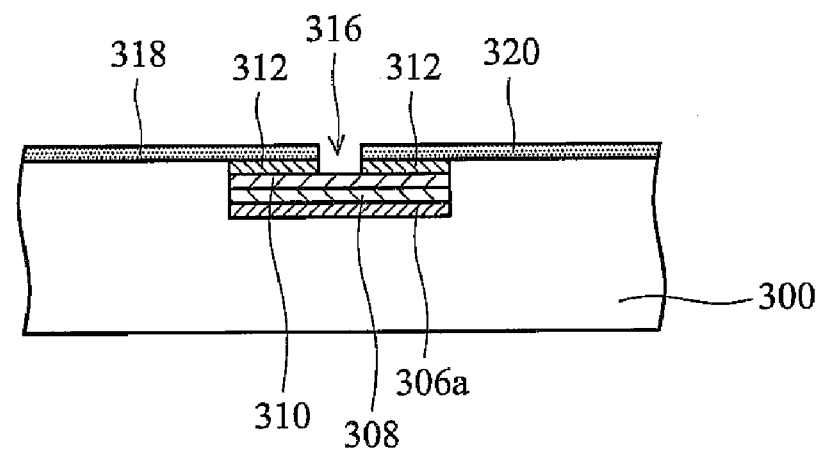
Figure 2F:
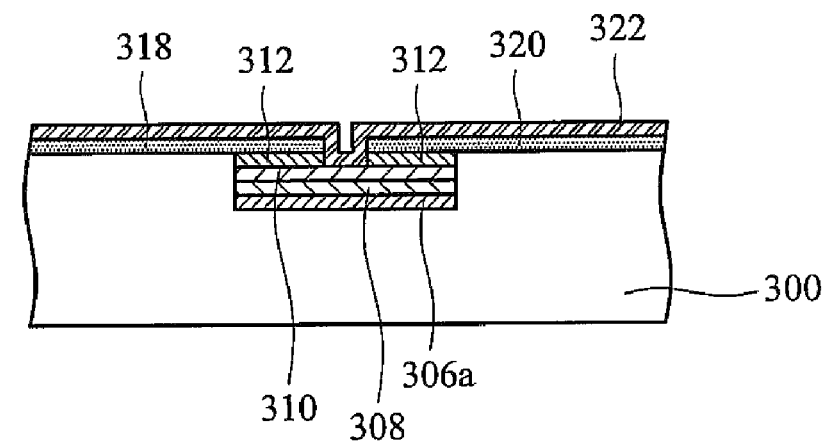

As shown in FIG. 2D, a second conductive layer 314 is deposited on the doped semiconductor layer 312 and the substrate 300. The second conductive layer 314 can comprise Ta, Mo, W, Ti, Cr, Al, Au, Ag, Pt, Cu, a combination thereof or a stack layer thereof. Next, as shown in FIG. 2E, the second conductive layer 314 and the doped semiconductor layer 312 in the trench are patterned to form an opening 316 exposing the semiconductor layer 310. In this embodiment, the patterned second conductor layer 314 acts as a source electrode 318 and a drain electrode 320 of a thin film transistor. Thereafter, as shown in FIG. 2F, a protective layer 322 is deposited on the second conductive layer 314 and filled the opening 316.

In this embodiment, due to formation of the gate, the gate dielectric layer and the semiconductor layer within the trench of the substrate, the thin film transistor on the array substrate is further more flat than conventional technology. In addition, since the gate dielectric layer is not formed in the display area, transmittance of the display panel is increased.

Figure 3A:
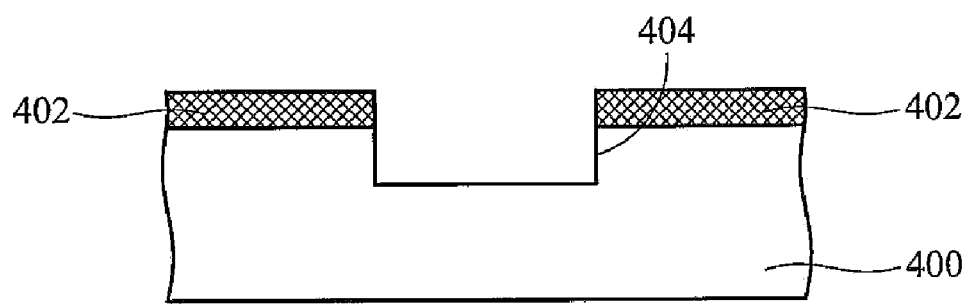
FIGS. 3A~3G illustrate process for forming a thin film transistor array substrate of another embodiment of the invention.

FIGS. 3A~3G illustrate process for forming a thin film transistor substrate of another embodiment of the invention. Referring to FIG. 3A, a substrate 400, such as a glass substrate, is provided, in which the substrate 400 preferably is a low alkali or a non-alkali substrate. Next, a photoresist layer 402 is coated on the substrate 400. The photoresist layer 402 is patterned by conventional photolithography, and preferably the patterned photoresist layer 402 comprises an opening exposing the substrate. Thereafter, the substrate 400 is etched by, for example dry etching, to form a first trench 404.

Figure 3B:
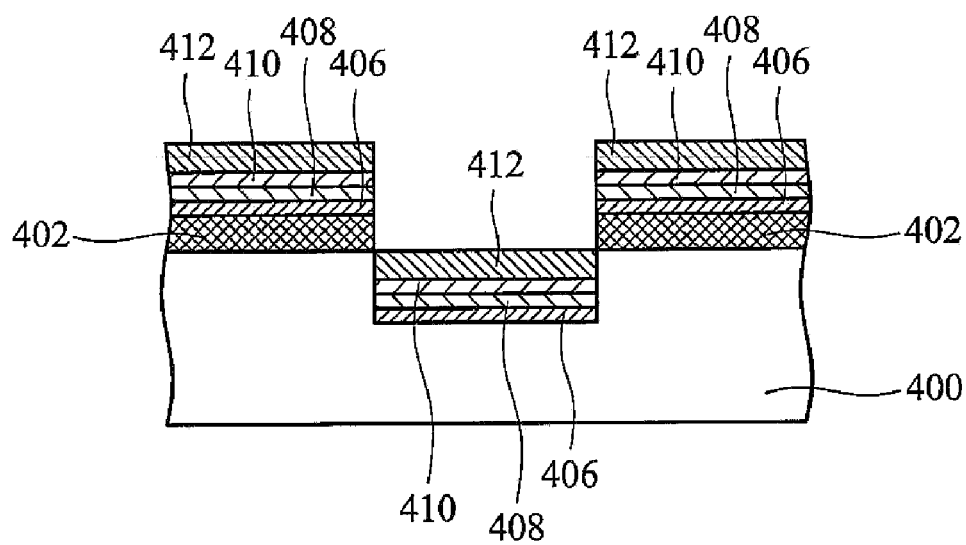

As shown in FIG. 3B, a first conductive layer 406, a gate dielectric layer 408, a semiconductor layer 410 and a dielectric layer 412 are deposited over the photoresist layer 402 and fill the trench 404. The first conductive layer 406 can be Ta, Mo, W, Ti, Cr, Al, Au, Ag, Pt, Cu, a combination thereof or a stack layer thereof. The first conductive layer 406 can be deposited by plasma vapor deposition (PVD) or plasma enhanced chemical vapor deposition (PECVD). The gate dielectric layer 408 can comprise silicon oxide, silicon nitride, silicon oxynitride or a combination thereof. In an embodiment of the invention, the semiconductor layer 410 comprises silicon, germanium, polysilicon or amorphous silicon. The dielectric layer 412 can comprise silicon oxide, silicon nitride, silicon oxynitride or a combination thereof.

Figure 3C:
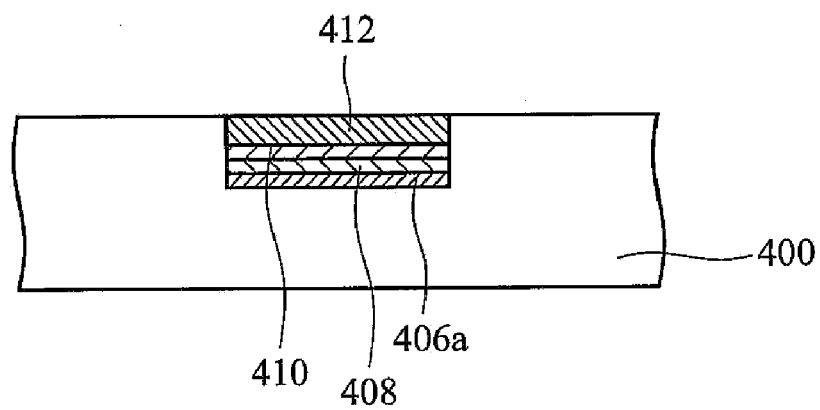

Next, as shown in FIG. 3C, a lift-off process is conducted, wherein the photoresist layer 402 is stripped by, for example etching or development, and the first conductive layer 406, the gate dielectric layer 408, the semiconductor layer 410 and the dielectric layer 412 overlying the photoresist layer 402 are removed during removal of the photoresist layer 402. In an embodiment of the invention, a stripper, such as propyl alcohol, which can be removed by methyl alcohol and methyl alcohol can further be removed by cleaning with deionized water, can remove the photoresist layer 202. Thereafter, methyl alcohol is removed by cleaning with deionized water. Next, the residue first conductive layer 406, gate dielectric layer 408, semiconductor layer 410 and dielectric layer 412 on the substrate surface are removed by a cleaning step. In this embodiment, the first conductive layer within the trench in the substrate 400 acts as a gate 406a of the thin film transistor.

Figure 3D:
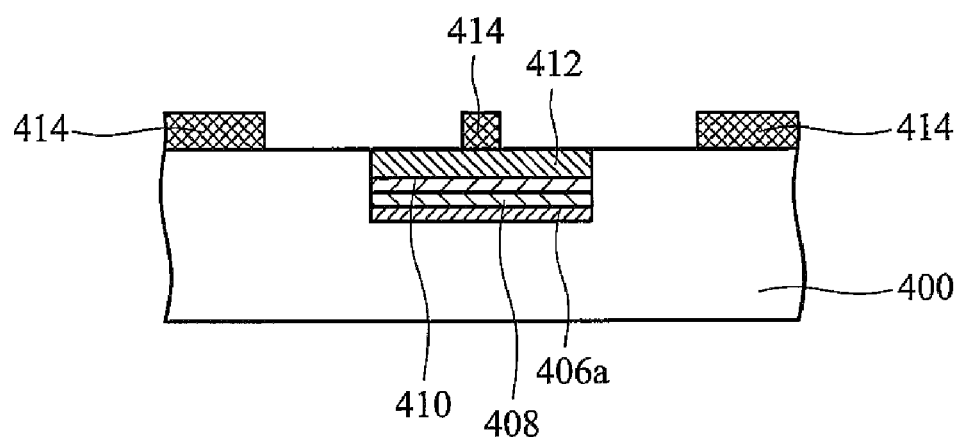
Figure 3E:
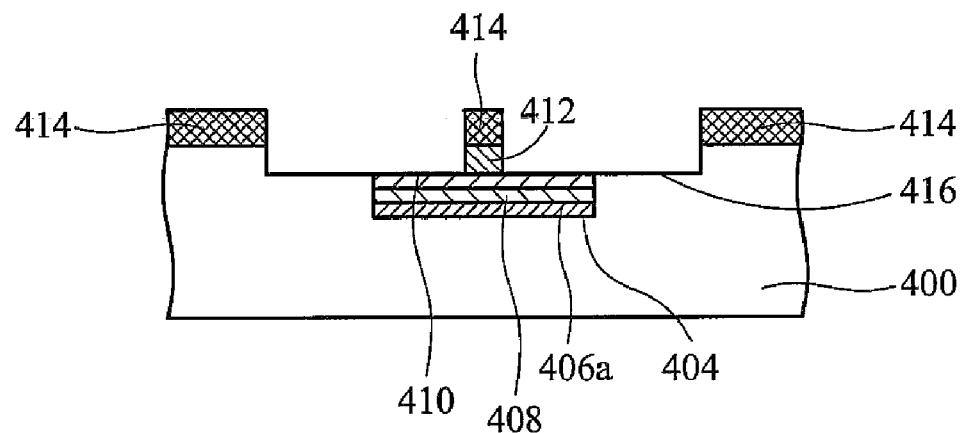

As shown in FIG. 3D, a second photoresist layer 414 is coated on the dielectric layer 412 and the substrate 400. Next, the second photoresist layer 414 is patterned by conventional photolithography. Specifically the patterned second photoresist layer covers a portion of the dielectric layer 412 and a portion of the substrate 400 beyond the trench. As shown in FIG. 3E, the exposed dielectric layer 412 and a portion of the substrate 400 uncovered by the second photoresist layer 414 are etched using the patterned second photoresist layer 414 as a mask to form a second trench 416 overlaying the first trench 404. In an embodiment of the invention, after etching, the remained dielectric layer 412 is substantially aligned to a channel of the semiconductor layer 410, and area of the second trench 416 is larger than the first trench 404. In FIG. 4E, a combination of the first trench 404 and the second trench 416 is substantially a dual damascene structure.

Figure 3F:
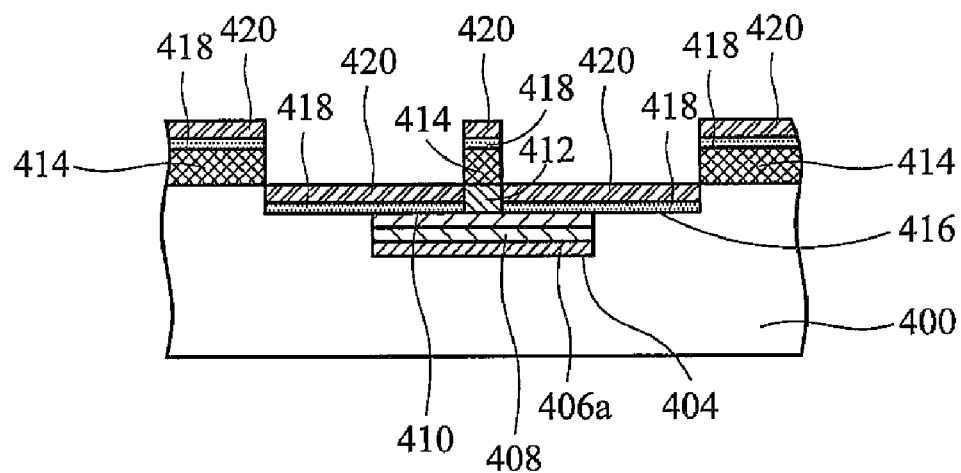

As shown in FIG. 3F, a doped semiconductor layer 418 and a second conductive layer 420 are deposited over the exposed substrate 400, the second trench 416 and the second photoresist layer 414. The second conductive layer 420 can comprise Ta, Mo, W, Ti, Cr, Al, Au, Ag, Pt, Cu, a combination thereof or a stack layer thereof. Preferably, the surface of the second conductive layer 420 in the trench is substantially coplanar with the surface of the substrate.

Figure 3G:
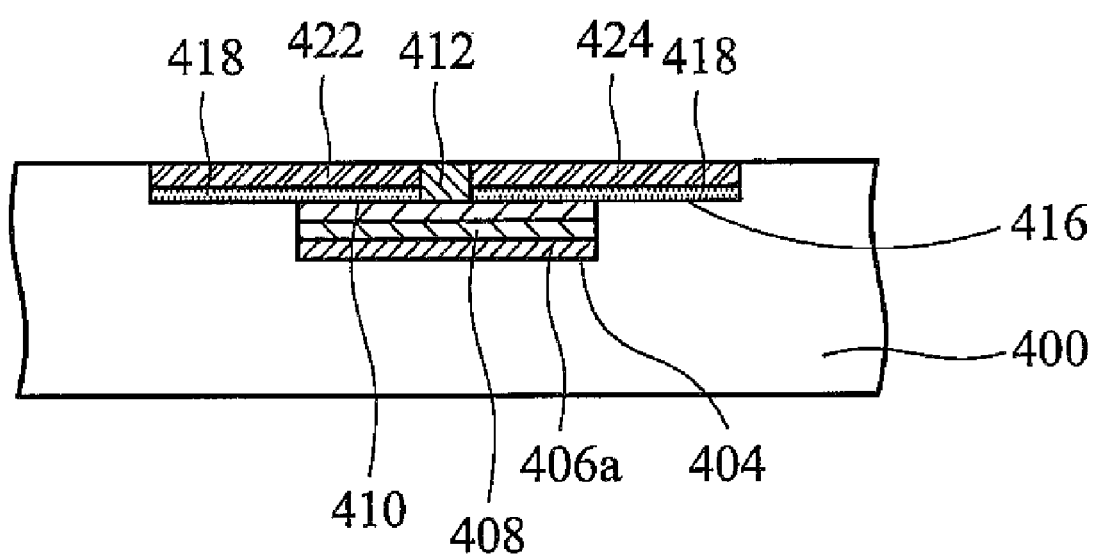

As shown in FIG. 3G, the second photoresist layer 414 is stripped, thus, the doped semiconductor layer 418 and the second conductive layer 420 are removed. In the embodiment of the invention, a thin film transistor is formed in the first trench and the second trench to provide a flat array substrate. In addition, since the gate dielectric layer is not formed in the display area, transmittance of the display panel is increased.

Referring to FIG. 2F, a cross section view of a thin film transistor of an embodiment of the invention, a trench 304 is formed in a substrate 300. A gate 306a, a gate dielectric layer 308 and a semiconductor layer 310 is disposed in the trench 304, in which the gate dielectric layer 308 is on the gate 306a and the semiconductor layer 310 is on the gate dielectric layer 308. The semiconductor layer 310 comprises a channel, and a source region and a drain region on opposite sides thereof. A doped semiconductor 312 is disposed in the trench 304 and on the source region and drain region of the semiconductor layer 310. A source electrode 318 covers a portion of doped semiconductor 312 overlaying the source region of the semiconductor layer 310, and the neighboring substrate 300 thereof. A drain electrode 320 covers a portion of doped semiconductor 312 overlaying the drain region of the semiconductor layer 310, and the neighboring substrate 300 thereof. A protective layer 322 substantially covers the source electrode 318, the drain electrode 320 and the channel of the semiconductor layer 310, electrically isolating the source electrode 318 and the drain electrode 320.

Referring to FIG. 3G, a cross section view of a thin film transistor of another embodiment of the invention, a first trench 404 and a second trench 416 are formed in a substrate 400. The first trench 404 is under the second trench 416, and the area of the second trench 416 is larger than the first trench 404. A gate 406a, a gate dielectric layer 408 and a semiconductor layer 410 comprising a channel, and source and drain regions on opposite sides thereof are disposed in the first trench 404, in which the gate dielectric layer 408 is on the gate 406a and the semiconductor layer 410 is on the gate dielectric layer 408. A dielectric layer 412 substantially covers channel of the semiconductor layer 410. A doped semiconductor layer 418 is disposed on a portion of the semiconductor layer and the substrate, adjacent to opposite sidewalls of the dielectric layer 412. The doped semiconductor layer 418 substantially covers the source region and the drain region of the semiconductor layer 410, and a bottom of the second trench 416. A source electrode 422 and a drain electrode 424 are disposed in the second trench 416, and are respectively disposed on a portion of the doped semiconductor layer 418 on opposite sides of the dielectric layer 412.

The thin film transistor in a preferred embodiment of the invention is formed in a trench of the substrate, eliminating issues from non-flat array substrate. Moreover, due to the lift-off process, process steps, process time and cost could be reduced. Additionally, the size of the trench, the conductive layer, the semiconductor layer and the dielectric layer can be fine tuned according to product design or process window.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A liquid crystal display array substrate, comprising:
    a substrate with a trench;
    a gate, a gate dielectric layer, a semiconductor layer with a channel and a doped semiconductor layer, disposed in the trench; and
    a source electrode and a drain electrode respectively electrically connected to the semiconductor layer on opposite sides of the channel through the doped semiconductor layer.

2. The liquid crystal display array substrate as claimed in claim 1, wherein the gate is formed on a bottom portion of the trench, the gate dielectric layer is formed on the gate, the semiconductor layer is formed on the gate dielectric layer, and the doped semiconductor layer is formed on the semiconductor layer.

3. The liquid crystal display array substrate as claimed in claim 1, wherein the doped semiconductor layer comprises an opening to substantially expose the channel and separate the doped semiconductor layer into two portions.

4. The liquid crystal display array substrate as claimed in claim 3, wherein the source electrode is disposed on a portion of the doped semiconductor layer, and the drain electrode is disposed on another portion thereof.

5. The liquid crystal display array substrate as claimed in claim 4, further comprising a protective layer covering the source electrode and the drain electrode, filling the opening and isolating the source electrode and the drain electrode.

6. The liquid crystal display array substrate as claimed in claim 1, wherein the substrate is a glass substrate.

* * * * *